United States Patent
Embleton et al.

(10) Patent No.: US 11,248,852 B2
(45) Date of Patent: Feb. 15, 2022

(54) GRAPHITE THERMAL CABLE AND METHOD FOR IMPLEMENTING SAME

(71) Applicant: Dell Products L.P., Round Rock, TX (US)

(72) Inventors: Steven Embleton, Austin, TX (US); Travis C. North, Cedar Park, TX (US)

(73) Assignee: Dell Products L.P., Round Rock, TX (US)

( * ) Notice: Subject to any disclaimer, the term of this patent is extended or adjusted under 35 U.S.C. 154(b) by 57 days.

(21) Appl. No.: 16/921,328

(22) Filed: Jul. 6, 2020

(65) Prior Publication Data
US 2022/0007545 A1    Jan. 6, 2022

(51) Int. Cl.
| | |
|---|---|
| F28F 1/00 | (2006.01) |
| F28F 21/02 | (2006.01) |
| H05K 7/20 | (2006.01) |
| H02G 15/007 | (2006.01) |
| H02G 15/02 | (2006.01) |
| H02G 15/00 | (2006.01) |
| H02G 1/14 | (2006.01) |
| H01B 12/14 | (2006.01) |

(52) U.S. Cl.
CPC .............. *F28F 1/006* (2013.01); *H02G 15/00* (2013.01); *H02G 15/007* (2013.01); *H02G 15/02* (2013.01); *F28F 21/02* (2013.01); *H01B 12/14* (2013.01); *H02G 1/14* (2013.01); *H05K 7/2039* (2013.01)

(58) Field of Classification Search
CPC ........... H05K 7/20254; H05K 7/20263; H05K 7/20272; H05K 7/20327; H05K 7/20336; H05K 7/20636; H05K 7/20663; H05K 7/20672; H05K 7/20772; H05K 7/20781; H05K 7/20809; H05K 7/20818; H05K 7/2039; F28D 15/0266; F28D 2021/0028; H01L 23/473; H01L 23/3677; H01L 23/3737
See application file for complete search history.

(56) References Cited

U.S. PATENT DOCUMENTS

| | | | | | |
|---|---|---|---|---|---|
| 3,404,061 | A | * | 10/1968 | Bochman | D01F 9/12 428/143 |
| 5,077,637 | A | * | 12/1991 | Martorana | H05K 7/20545 361/717 |
| 5,224,030 | A | * | 6/1993 | Banks | F28F 21/02 165/185 |
| 5,255,738 | A | * | 10/1993 | Przilas | B32B 5/08 165/185 |
| 5,390,734 | A | * | 2/1995 | Voorhes | F28F 13/00 165/185 |
| 5,769,158 | A | * | 6/1998 | Yao | F28F 13/00 165/185 |

(Continued)

*Primary Examiner* — Jianying C Atkisson
*Assistant Examiner* — Jose O Class-Quinones
(74) *Attorney, Agent, or Firm* — Jackson Walker L.L.P.

(57) ABSTRACT

A system may include a thermal source, a thermal sink and heat-rejecting media comprising a thermal cable, the thermal cable comprising a main length comprising a flexible graphite layer rolled into a cylindrical shape covered on the outside thereof by a thermally-insulating layer of the same cylindrical shape, a first termination at which the flexible graphite layer thermally couples to the thermal source, and a second termination at which the flexible graphite layer thermally couples to the thermal sink.

21 Claims, 3 Drawing Sheets

(56) References Cited

U.S. PATENT DOCUMENTS

| | | | | |
|---|---|---|---|---|
| 6,060,166 A * | 5/2000 | Hoover | B29C 70/546 | |
| | | | 428/408 | |
| 6,131,651 A * | 10/2000 | Richey, III | F28F 13/00 | |
| | | | 165/185 | |
| 6,286,591 B1 * | 9/2001 | Bonneville | H05K 7/20445 | |
| | | | 165/185 | |
| 6,367,509 B1 * | 4/2002 | Bonneville | F28F 21/02 | |
| | | | 138/109 | |
| 6,452,093 B1 * | 9/2002 | Ishii | H05K 7/20445 | |
| | | | 174/16.3 | |
| 6,542,370 B1 * | 4/2003 | Wang | H01L 23/467 | |
| | | | 165/185 | |
| 7,308,931 B2 * | 12/2007 | Pokharna | F28D 15/0275 | |
| | | | 165/104.21 | |
| 7,319,590 B1 * | 1/2008 | Ingram | H01L 23/367 | |
| | | | 361/704 | |
| 7,463,484 B2 * | 12/2008 | Wang | H01L 23/467 | |
| | | | 165/121 | |
| 7,688,586 B2 * | 3/2010 | Tomioka | H01L 23/367 | |
| | | | 361/695 | |
| 9,847,151 B2 * | 12/2017 | Asiri | H01B 1/08 | |
| 10,008,435 B2 * | 6/2018 | Matsubara | H01L 21/4871 | |
| 10,154,613 B1 * | 12/2018 | Lin | H05K 7/2039 | |
| 10,345,054 B2 * | 7/2019 | Sauer | B23P 15/26 | |
| 10,752,078 B2 * | 8/2020 | Ito | B60H 1/00985 | |
| 2005/0168941 A1 * | 8/2005 | Sokol | H05K 7/20445 | |
| | | | 361/688 | |
| 2006/0113064 A1 * | 6/2006 | Pokharna | H01L 23/427 | |
| | | | 165/104.14 | |
| 2010/0227764 A1 * | 9/2010 | Willen | H01B 12/16 | |
| | | | 505/163 | |
| 2011/0186270 A1 * | 8/2011 | Chou | F28F 21/02 | |
| | | | 165/104.28 | |
| 2012/0211118 A1 * | 8/2012 | Tognon | F16L 59/143 | |
| | | | 138/149 | |
| 2012/0216395 A1 * | 8/2012 | Tognon | B21C 37/154 | |
| | | | 29/700 | |
| 2012/0263940 A1 * | 10/2012 | Arzberger | H01B 1/04 | |
| | | | 428/328 | |
| 2013/0294096 A1 * | 11/2013 | Petroski | F21S 6/002 | |
| | | | 362/373 | |
| 2015/0104661 A1 * | 4/2015 | Wu | B29C 43/24 | |
| | | | 428/523 | |
| 2015/0118482 A1 * | 4/2015 | Kagawa | B32B 27/308 | |
| | | | 428/323 | |
| 2015/0211815 A1 * | 7/2015 | Sauer | F28F 21/065 | |
| | | | 165/185 | |
| 2016/0154441 A1 * | 6/2016 | Shen | G06F 1/203 | |
| | | | 361/679.03 | |
| 2016/0154442 A1 * | 6/2016 | Shen | G06F 1/203 | |
| | | | 361/679.03 | |
| 2016/0201994 A1 * | 7/2016 | Shen | G06F 1/163 | |
| | | | 165/104.26 | |
| 2017/0001492 A1 * | 1/2017 | Ito | H05K 7/2039 | |
| 2017/0063101 A1 * | 3/2017 | Sultenfuss | H01F 27/16 | |
| 2017/0208706 A1 * | 7/2017 | Short, Jr | H05K 7/2039 | |
| 2017/0358517 A1 * | 12/2017 | Matsubara | H01L 21/4871 | |
| 2017/0365538 A1 * | 12/2017 | Dornauer | C01B 32/20 | |
| 2018/0023904 A1 * | 1/2018 | Kato | B32B 27/38 | |
| | | | 165/80.2 | |
| 2018/0284856 A1 * | 10/2018 | Shah | G06F 1/1616 | |

* cited by examiner

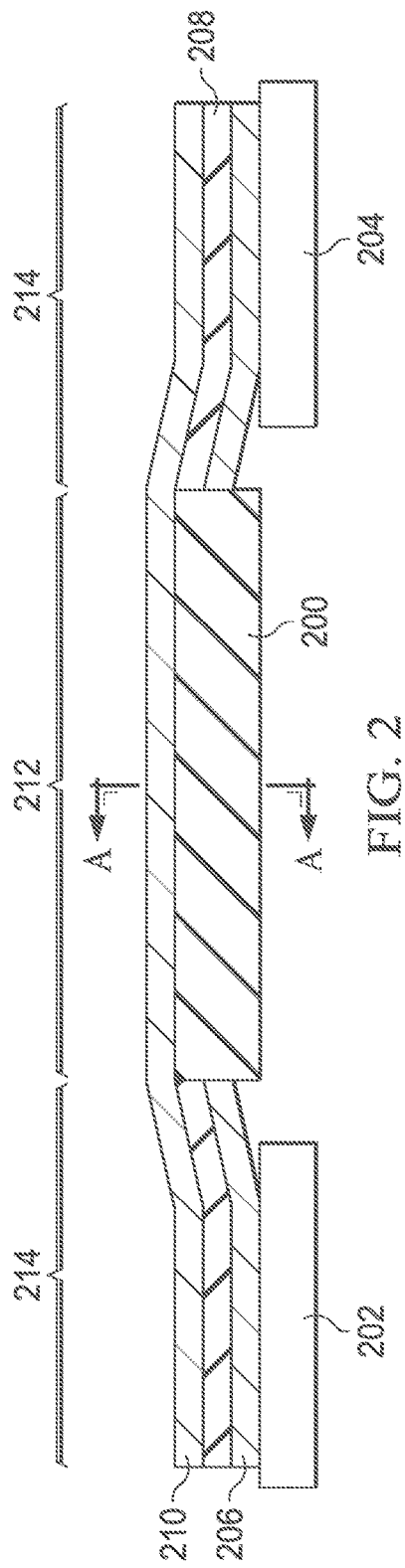
FIG. 2
FIG. 3A
FIG. 3B
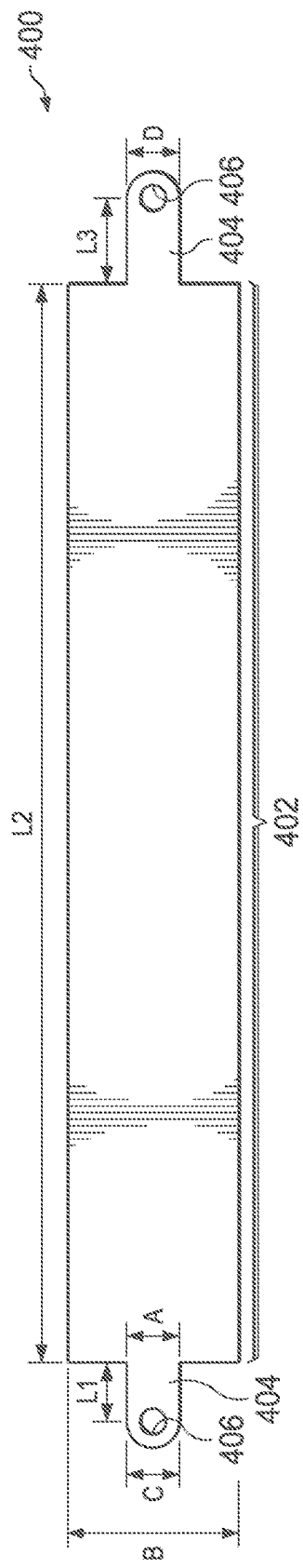
FIG. 4

GRAPHITE THERMAL CABLE AND METHOD FOR IMPLEMENTING SAME

TECHNICAL FIELD

The present disclosure relates in general to information handling systems, and more particularly to cooling of information handling system components using a flexible graphite thermal cable as heat-rejecting media.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

As processors, graphics cards, random access memory (RAM) and other components in information handling systems have increased in clock speed and power consumption, the amount of heat produced by such components as a side-effect of normal operation has also increased. Often, the temperatures of these components need to be kept within a reasonable range to prevent overheating, instability, malfunction and damage leading to a shortened component lifespan. Accordingly, air movers (e.g., cooling fans and blowers) have often been used in information handling systems to cool information handling systems and their components.

To control temperature of components of an information handling system, an air mover may direct air over one or more heatsinks thermally coupled to individual components. Traditional approaches to cooling components may include a "passive" cooling system that serves to reject heat of a component to air driven by one or more system-level air movers (e.g., fans) for cooling multiple components of an information handling system in addition to the peripheral component. Another traditional approach may include an "active" cooling system that uses liquid cooling, in which a heat-exchanging cold plate is thermally coupled to the component, and a chilled fluid is passed through conduits internal to the cold plate to remove heat from the component.

Employing liquid cooling in information handling systems, particularly servers, is challenging. The liquid flow required may necessitate large-diameter tubes with little room for routing such tubes. Thermal coupling to information handling resources may also be difficult, often requiring thick and rigid copper components.

Existing servers may include a rigid fluid delivery system which often requires 30 to 60 minutes to change a processor. Further, current memory cooling solutions employ a liquid tube through the memory components which requires increased memory module pitch, and thus decreases density. Such memory cooling solutions require stressing memory during installation and the use of a jig to hold the memory in place.

SUMMARY

In accordance with the teachings of the present disclosure, the disadvantages and problems associated with traditional approaches to cooling information handling system components may be substantially reduced or eliminated.

In accordance with embodiments of the present disclosure, a system may include a thermal source, a thermal sink and heat-rejecting media comprising a thermal cable, the thermal cable comprising a main length comprising a flexible graphite layer rolled into a cylindrical shape covered on the outside thereof by a thermally-insulating layer of the same cylindrical shape, a first termination at which the flexible graphite layer thermally couples to the thermal source, and a second termination at which the flexible graphite layer thermally couples to the thermal sink.

In accordance with these and other embodiments of the present disclosure, a thermal cable may include a main length comprising a flexible graphite layer rolled into a cylindrical shape covered on the outside thereof by a thermally-insulating layer of the same cylindrical shape, a first termination at which the flexible graphite layer is configured to thermally couple to a thermal source, and a second termination at which the flexible graphite layer is configured to thermally couple to a thermal sink.

In accordance with these and other embodiments of the present disclosure, a method for forming a thermal cable may include rolling a flexible graphite layer into a cylindrical shape covered on the outside thereof by a thermally-insulating layer of the same cylindrical shape to form a main length of the thermal cable, forming a first termination at which the flexible graphite layer is configured to thermally couple to a thermal source, and forming a second termination at which the flexible graphite layer is configured to thermally couple to a thermal sink.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein:

FIG. 2 illustrates a side elevation view of an example thermal cable coupled between a thermal source and a thermal sink, in accordance with embodiments of the present disclosure;

FIG. 3A illustrates a cross-sectional view of an example thermal cable such as that shown in FIG. 2, in accordance with embodiments of the present disclosure;

FIG. 3B illustrates a cross-sectional view of another example thermal cable such as that shown in FIG. 2, in accordance with embodiments of the present disclosure;

FIG. 4 illustrates a top plan view of a blank of flexible graphite that may be used to form the thermal cable depicted in FIG. 2, in accordance with embodiments of the present disclosure;

DETAILED DESCRIPTION

Preferred embodiments and their advantages are best understood by reference to FIGS. 1 through 5C, wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network storage device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, computer-readable media may include any instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory; as well as communications media such as wires, optical fibers, microwaves, radio waves, and other electromagnetic and/or optical carriers; and/or any combination of the foregoing.

For the purposes of this disclosure, information handling resources may broadly refer to any component system, device or apparatus of an information handling system, including without limitation processors, buses, memories, I/O devices and/or interfaces, storage resources, network interfaces, motherboards, integrated circuit packages; electro-mechanical devices (e.g., air movers), displays, and power supplies.

Figure 1:
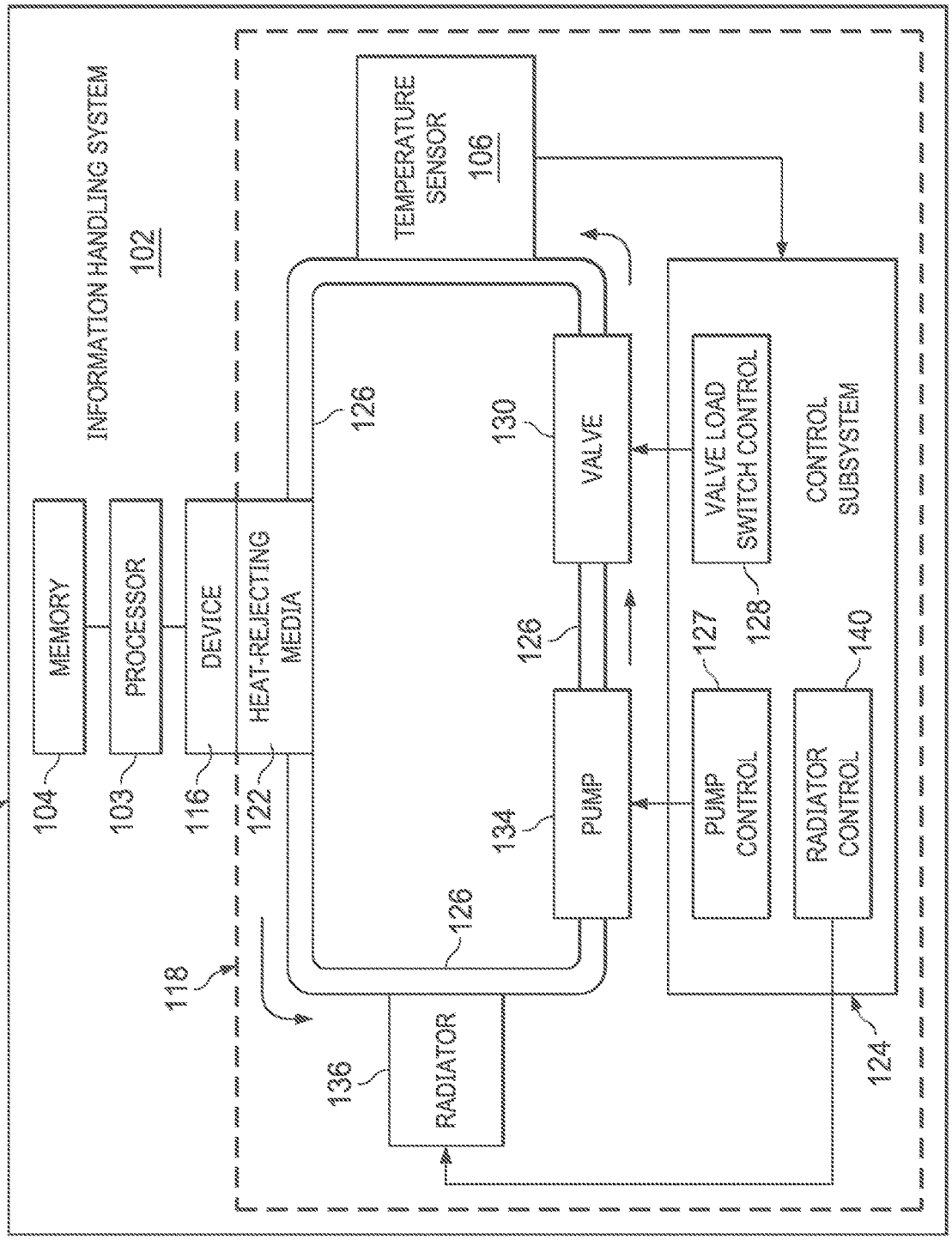
FIG. 1 illustrates a block diagram of an example information handling system, in accordance with embodiments of the present disclosure.

FIG. 1 illustrates a block diagram of an example information handling system 102, in accordance with embodiments of the present disclosure. In some embodiments, information handling system 102 may comprise a server chassis configured to house a plurality of servers or "blades." In other embodiments, information handling system 102 may comprise a personal computer (e.g., a desktop computer, laptop computer, mobile computer, and/or notebook computer). In yet other embodiments, information handling system 102 may comprise a storage enclosure configured to house a plurality of physical disk drives and/or other computer-readable media for storing data. As shown in FIG. 1, information handling system 102 may include a chassis 100 housing a processor 103, a memory 104, a device 116, and a liquid thermal control system 118.

Processor 103 may comprise any system, device, or apparatus operable to interpret and/or execute program instructions and/or process data, and may include, without limitation a microprocessor, microcontroller, digital signal processor (DSP), application specific integrated circuit (ASIC), or any other digital or analog circuitry configured to interpret and/or execute program instructions and/or process data. In some embodiments, processor 103 may interpret and/or execute program instructions and/or process data stored in memory 104 and/or another component of information handling system 102.

Memory 104 may be communicatively coupled to processor 103 and may comprise any system, device, or apparatus operable to retain program instructions or data for a period of time. Memory 104 may comprise random access memory (RAM), electrically erasable programmable read-only memory (EEPROM), a PCMCIA card, flash memory, magnetic storage, opto-magnetic storage, or any suitable selection and/or array of volatile or non-volatile memory that retains data after power to information handling system 102 is turned off.

Device 116 may comprise any component information handling system of information handling system 102, including without limitation processors, buses, memories, I/O devices and/or interfaces, storage resources, network interfaces, motherboards, integrated circuit packages, electro-mechanical devices, displays, and power supplies.

As shown in FIG. 1, liquid thermal control system 118 may include a temperature sensor 106, a control subsystem 124, heat-rejecting media 122, pump 134, radiator 136, valve 130, fluidic conduits 126, and radiator control 140.

Temperature sensor 106 may be any system, device, or apparatus (e.g., a thermometer, thermistor, etc.) configured to communicate a signal to processor 103 or another controller indicative of a temperature within information handling system 102. In many embodiments, information handling system 102 may comprise a plurality of temperature sensors 106, wherein each temperature sensor 106 detects a temperature of a particular component and/or location within information handling system 102. Although FIG. 1 shows temperature sensor 106 in thermal communication with fluidic conduits 126 in order to determine a temperature of fluid therein, it is understood that temperature sensor 106 may appear in any suitable location within information handling system 102.

Control subsystem 124 may be communicatively coupled to temperature sensor 106, and may include any system, device, or apparatus (e.g., a processor, controller, etc.) configured to control components of liquid thermal control system 118 for increasing or decreasing a temperature of one or more information handling resources of information handling system 102. For example, control subsystem 124 may be configured to control pump 134, valve 130, and/or radiator 136 based on thermal data sensed by temperature sensor 106, so as to maintain a safe operating temperature for one or more information handling resources. Accordingly, control subsystem 124 may include a pump control subsystem 127 for controlling operation of pump 134 (e.g., a pressure applied to coolant fluid in fluidic conduits 126 for moving such fluid through fluidic conduits 126), a valve load switch control subsystem 128 for controlling operation of valve 130 (e.g., opening or closing valve 130, controlling an aperture of valve 130, etc.), and a radiator control subsystem 140 for controlling operation of radiator 136 (e.g., enabling or disabling radiator 136, etc.).

Pump 134 may be fluidically coupled to one or more fluidic conduits 126 and may comprise any mechanical or electro-mechanical system, apparatus, or device operable to produce a flow of fluid (e.g., fluid in one or more conduits 126). For example, pump 134 may produce fluid flow by applying a pressure to fluid in fluidic conduits 126. As described above, operation of pump 134 may be controlled by pump control subsystem 127 which may control electro-mechanical components of pump 134 in order to produce a desired rate of coolant flow.

Radiator 136 may include any device, system or apparatus configured to transfer thermal energy from one medium (e.g., fluid within a fluidic conduit 126) to another (e.g., air external to chassis 100) for the purpose of cooling and heating. In some embodiments, radiator 136 may include fluidic channels and/or conduits in at least a portion of radiator 136. Such fluidic channels and/or conduits may be fluidically coupled to one or more of fluidic conduits 126 and pump 134. As described above, operation of radiator 136 may be controlled by heater/radiator control subsystem 140 which may control components of radiator 136 in order to produce a desired rate of heat transfer from the liquid within fluidic conduits 126.

Valve 130 may include any device, system or apparatus that regulates, directs, and/or controls the flow of a fluid (e.g., a coolant liquid in fluidic conduits 126) by opening, closing, or partially obstructing one or more passageways. When valve 130 is open, coolant liquid may flow in a direction from higher pressure to lower pressure. As described above, the operation of valve 130 (e.g., opening and closing, size of an aperture of valve 130) may be controlled by valve load switch control subsystem 128.

In operation, pump 134 may induce a flow of liquid (e.g., water, ethylene glycol, propylene glycol, or other coolant) through various fluidic conduits 126 of information handling system 102, valve 130 and/or radiator 136. As fluid passes by heat-rejecting media 122 in a fluidic conduit 126 proximate to device 116, heat may be transferred from device 116 to heat-rejecting media 122 and from heat-rejecting media 122 to the liquid in fluidic conduit 126. As such heated liquid flows by radiator 136, heat from the liquid may be transferred from the liquid to air ambient to chassis 100, thus cooling the liquid.

Heat-rejecting media 122 may include any system, device, or apparatus configured to transfer heat from an information handling resource (e.g., device 116, as shown in FIG. 1), thus reducing a temperature of the information handling resource. For example, heat-rejecting media 122 may include a solid thermally coupled to the information handling resource (e.g., heatpipe, heat spreader, heatsink, finstack, heat fin, heat bridge, etc.) such that heat generated by the information handling resource is transferred from the information handling resource. In some embodiments, heat-rejecting media 122 may comprise a heat spreader, heat fine, or heat bridge comprising flexible graphite shaped in a desired manner, or any material having similar properties to flexible graphite, including a pliability/flexibility at room temperature and a thermal conductivity at least three times that of copper. Further as described in greater detail below, in some embodiments, heat-rejecting media 122 may comprise a heat-pipe comprising flexible graphite shaped in a desired manner. In some embodiments, graphite comprising heat-rejecting media 122 may be anisotropic, with a thermal conductivity three times that of copper along two axis of the graphite, but with poor thermal conductivity along its third axis (e.g., thickness).

In addition to processor 103, memory 104, temperature sensor 106, device 116, and liquid thermal control system 118, information handling system 102 may include one or more other information handling resources. In addition, for the sake of clarity and exposition of the present disclosure, FIG. 1 depicts only one device 116. In embodiments of the present disclosure, information handling system 102 may include any number of devices 116. Furthermore, for the sake of clarity and exposition of the present disclosure, FIG. 1 depicts device 116 including a liquid thermal control system 118 for cooling of device 116. However, in some embodiments, approaches similar or identical to those used to cool device 116 as described herein may be employed to provide cooling of processor 103, memory 104, and/or any other information handling resource of information handling system 102.

FIG. 2 illustrates a side elevation view of an example thermal cable 200 coupled between a thermal source 202 (e.g., a heat-generating device 116) and a thermal sink 204 (e.g., a fluidic conduit 126), in accordance with embodiments of the present disclosure. In some embodiments, thermal cable 200 may be used to implement all or a part of heat-rejecting media 122.

As shown in FIG. 2, thermal cable 202 may include a main length 212 and terminations 214. At terminations 214, a flexible graphite layer 206 may be mechanically and thermally coupled to either of thermal source 202 or thermal sink 204, with a thermally-insulating layer 208 (e.g., aerogel or other suitable thermally-insulating material) formed over flexible graphite layer 206, and with a strain relief layer 210 formed over thermally-insulating layer 208. The presence of thermally-insulating layer 208 over flexible graphite layer 206 at terminations 214 may enhance serviceability of thermal cable 200, potentially allowing a technician to be protected from heat within flexible graphite layer 206 when servicing (e.g., removing or installing) thermal cable 200. Within main length 212, flexible graphite layer 206 may be rolled (e.g., in a cylindrical or spiraled manner as described in greater detail below), with thermally-insulating layer 208 wrapped around flexible graphite layer 206 throughout main length 212. In addition, strain relief layer 210 may run along the outside of thermally-insulating layer 208 throughout main length 212. Accordingly, strain relief layer 210 may provide mechanical strain relief throughout thermal cable 200.

FIG. 3A illustrates a cross-sectional view taken along the line A-A of FIG. 2 of an example thermal cable 200A, in accordance with embodiments of the present disclosure. In some embodiments, thermal cable 200A may be used to implement thermal cable 200. As shown in FIG. 3A, main length 212 of thermal cable 200A may be formed by forming a circular cylinder of flexible graphite layer 206, with a substantially co-centric circular cylinder of thermally-insulating layer 208 wrapped around flexible graphite layer 206.

FIG. 3B illustrates a cross-sectional view taken along the line A-A of FIG. 2 of an example thermal cable 200B, in accordance with embodiments of the present disclosure. In some embodiments, thermal cable 200B may be used to implement thermal cable 200. As shown in FIG. 3B, main length 212 of thermal cable 200A may be formed by forming a spiraled cylinder of flexible graphite layer 206 (e.g., such that each lateral cross-section of main length 212 approximates a spiral shape), with thermally-insulating layer 208 wrapped around flexible graphite layer 206 in its own spiraled cylinder shape. Using such spiraled cylinder shape may be preferable to the circular cylinder shape of thermal cable 200A, as maximizing a cross-sectional area of flexible graphite layer 206 may minimize a thermal resistance of thermal cable 200B.

FIG. 4 illustrates a top plan view of a blank 400 of flexible graphite that may be used to form flexible graphite layer 206 of thermal cable 200, in accordance with embodiments of the present disclosure. As shown in FIG. 4, blank 400 may include a main length 402 having width B and length L2 and corresponding to main length 212 of thermal cable 200. Blank 400 may also include terminations 404 corresponding to terminations 214 of thermal cable 200. A first termination 404 may have length L1 and width C, and a second termination 404 may have length L3 and width D, wherein length L1 may or may not be equal to length L3 and wherein width C may or may not be equal to width D. To form flexible graphite layer 206 of either thermal cable 200A or thermal cable 200B, main length 402 of blank 400 may be rolled into an appropriate shape (e.g., circular cylinder or spiraled cylinder) about width B, such that an axis of the circular cylinder or spiraled cylinder formed by main length 402 of blank 400 runs generally parallel with length L2.

As shown in FIG. 4, one or both terminations 404 may include a mounting hole 406 for fastening (e.g., with a bolt, screw, pin, or other fastener) a termination 404 to thermal source 202 or thermal sink 204. In some embodiments, a termination 404 may not include a mounting hole, in which case such termination 404 may be mechanically and thermally coupled to thermal source 202 or thermal sink 204 via an adhesive, thermal interface material, or via a mechanical force/pressure applied to either of termination 404 and thermal source 202/thermal sink 204 to maintain thermal coupling.

In some embodiments, a termination 404 may not be directly coupled to thermal source 202 or thermal sink 204, but may instead be coupled to a cap that provides a thermal interface between termination 404 and thermal source 202/thermal sink 204.

Figure 5B:
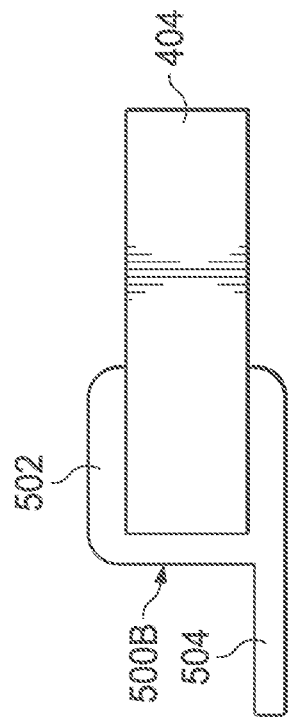
FIG. 5B illustrates a top plan view of another example thermal cable termination coupled to another example cap, in accordance with embodiments of the present disclosure.
Figure 5C:
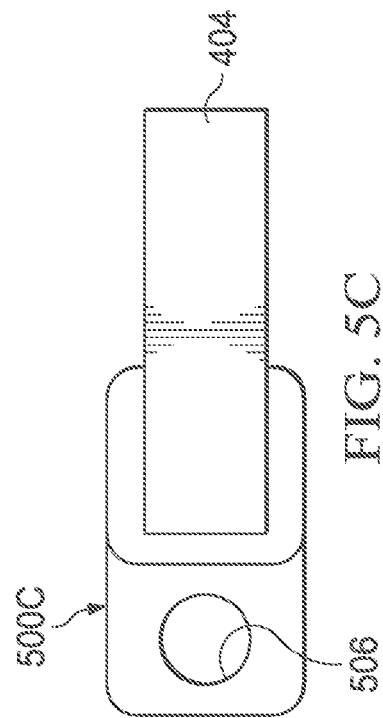
FIG. 5C illustrates a top plan view of another example thermal cable termination coupled to another example cap, in accordance with embodiments of the present disclosure.
Figure 5A:
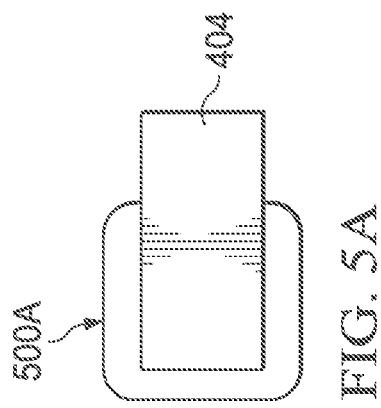
FIG. 5A illustrates a top plan view of an example thermal cable termination coupled to an example cap, in accordance with embodiments of the present disclosure.

FIG. 5A illustrates a top plan view of an example termination 404 coupled to an example cap 500A, in accordance with embodiments of the present disclosure. Cap 500A may comprise any suitable thermally-conductive material (e.g., copper) and may be of any suitable size or shape (e.g., predominantly flat with a predominantly rectangular shape). Cap 500A may be coupled to termination 404 via adhesive, solder, thermal interface material, and/or mechanical force/pressure. Cap 500A may in turn be coupled to thermal source 202 or thermal sink 204 via adhesive, thermal interface material, and/or mechanical force/pressure.

FIG. 5B illustrates a top plan view of an example termination 404 coupled to an example cap 500B, in accordance with embodiments of the present disclosure. Cap 500B may comprise any suitable thermally-conductive material (e.g., copper) and may be of any suitable size or shape. As shown in FIG. 5B, cap 500B may have a main portion 502 and an extension 504, which may provide desired thermal routing and/or may serve as an alignment mechanism. Cap 500B may be coupled to termination 404 via adhesive, solder, thermal interface material, and/or mechanical force/pressure. Cap 500B may in turn be coupled to thermal source 202 or thermal sink 204 via adhesive, thermal interface material, and/or mechanical force/pressure.

FIG. 5C illustrates a top plan view of an example termination 404 coupled to an example cap 500C, in accordance with embodiments of the present disclosure. Cap 500C may comprise any suitable thermally-conductive material (e.g., copper) and may be of any suitable size or shape. As shown in FIG. 5C, cap 500C may include a mounting hole 506 for fastening (e.g., with a bolt, screw, pin, or other fastener) cap 500C to thermal source 202 or thermal sink 204. Cap 500C may be coupled to termination 404 via adhesive, solder, thermal interface material, and/or mechanical force/pressure.

In operation, thermal cable 200 may in effect operate as a heat pipe to transfer heat from thermal source 202 to thermal sink 204. In particular, flexible graphite layer 206 may transfer heat from thermal source 202 to thermal sink 204, while thermally-insulating layer 208 may insulate flexible graphite layer 206 from transferring heat to ambient air or other components, and while strain relief layer 210 may provide desired mechanical strain relief through thermal cable 200.

Although the foregoing contemplates use of flexible graphite layer 206 as a thermal pathway between thermal source 202 and thermal sink 204, it is understood that flexible materials similar in mechanical flexibility/pliability to flexible graphite and similar in thermal conductivity (e.g., thermal conductivity at least three times that of copper) may be used in lieu of graphite.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. A system comprising:
    a thermal source;
    a thermal sink; and
    heat-rejecting media comprising a thermal cable, the thermal cable comprising:
        a main length comprising a flexible graphite layer rolled into a cylindrical shape covered on the outside thereof by a thermally-insulating layer of the same cylindrical shape;
        a first termination at which the flexible graphite layer thermally couples to the thermal source; and
        a second termination at which the flexible graphite layer thermally couples to the thermal sink.

2. The system of claim 1, wherein the cylindrical shape comprises one of a circular cylindrical shape and a spiraled cylindrical shape.

3. The system of claim 1, the thermal cable further comprising a strain relief member mechanically coupled to the thermally-insulating layer to provide mechanical strain relief to the thermal cable.

4. The system of claim 1, wherein a termination comprising one of the first termination and the second termination is thermally and mechanically coupled to a thermally-conductive cap interfaced between the termination and one of the thermal source and the thermal sink.

5. The system of claim 4, wherein the thermally-conductive cap comprises at least one of a mounting feature and an alignment feature to mechanically couple the thermally-conductive cap to one of the thermal source and the thermal sink.

6. The system of claim 1, wherein the thermally-insulating layer covers the flexible graphite layer within at least one of the first termination and the second termination.

7. The system of claim 1, wherein the thermally-insulating layer comprises aerogel.

8. A thermal cable comprising:
    a main length comprising a flexible graphite layer rolled into a cylindrical shape covered on the outside thereof by a thermally-insulating layer of the same cylindrical shape;
    a first termination at which the flexible graphite layer is configured to thermally couple to a thermal source; and
    a second termination at which the flexible graphite layer is configured to thermally couple to a thermal sink.

9. The thermal cable of claim 8, wherein the cylindrical shape comprises one of a circular cylindrical shape and a spiraled cylindrical shape.

10. The thermal cable of claim 8, the thermal cable further comprising a strain relief member mechanically coupled to the thermally-insulating layer to provide mechanical strain relief to the thermal cable.

11. The thermal cable of claim 8, wherein a termination comprising one of the first termination and the second termination is thermally and mechanically coupled to a thermally-conductive cap configured to interface between the termination and one of the thermal source and the thermal sink.

12. The thermal cable of claim 11, wherein the thermally-conductive cap comprises at least one of a mounting feature and an alignment feature configured to mechanically couple the thermally-conductive cap to one of the thermal source and the thermal sink.

13. The thermal cable of claim 8, wherein the thermally-insulating layer covers the flexible graphite layer within at least one of the first termination and the second termination.

14. The thermal cable of claim 8, wherein the thermally-insulating layer comprises aerogel.

15. A method for forming a thermal cable comprising:
    rolling a flexible graphite layer into a cylindrical shape covered on the outside thereof by a thermally-insulating layer of the same cylindrical shape to form a main length of the thermal cable;
    forming a first termination at which the flexible graphite layer is configured to thermally couple to a thermal source; and
    forming a second termination at which the flexible graphite layer is configured to thermally couple to a thermal sink.

16. The method of claim 15, wherein the cylindrical shape comprises one of a circular cylindrical shape and a spiraled cylindrical shape.

17. The method of claim 15, further comprising mechanically coupling a strain relief member to the thermally-insulating layer to provide mechanical strain relief to the thermal cable.

18. The method of claim 15, further comprising thermally and mechanically coupling a termination comprising one of the first termination and the second termination to a thermally-conductive cap configured to interface between the termination and one of the thermal source and the thermal sink.

19. The method of claim 18, wherein the thermally-conductive cap comprises at least one of a mounting feature and an alignment feature configured to mechanically couple the thermally-conductive cap to one of the thermal source and the thermal sink.

20. The method of claim 15, further comprising covering the flexible graphite layer with the thermally-insulating layer within at least one of the first termination and the second termination.

21. The method of claim 15, wherein the thermally-insulating layer comprises aerogel.

* * * * *